(12) United States Patent
Goldmann et al.

(10) Patent No.: US 6,724,203 B1
(45) Date of Patent: Apr. 20, 2004

(54) FULL WAFER TEST CONFIGURATION USING MEMORY METALS

(75) Inventors: Lewis S. Goldmann, Bedford, NY (US); Chandrika Prasad, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 1066 days.

(21) Appl. No.: 08/960,565

(22) Filed: Oct. 30, 1997

(51) Int. Cl.⁷ .............................................. G01R 31/02
(52) U.S. Cl. ....................... 324/754; 324/758; 324/761
(58) Field of Search ................................ 324/754, 761, 324/758, 765, 755, 158.1

(56) References Cited

U.S. PATENT DOCUMENTS

| | | | |
|---|---|---|---|
| 3,174,851 A | * 3/1965 | Buehler et al. ................ 75/170 |
| 4,639,060 A | 1/1987 | Lionnet |
| 4,764,848 A | 8/1988 | Simpson |
| 4,777,564 A | 10/1988 | Derfiny et al. |
| 4,793,814 A | 12/1988 | Zifcak et al. |
| 4,893,172 A | 1/1990 | Matsumoto et al. |
| 4,989,069 A | 1/1991 | Hawkins |
| 4,993,957 A | 2/1991 | Shino |
| 5,067,007 A | 11/1991 | Otsuka et al. |
| 5,086,337 A | 2/1992 | Noro et al. |
| 5,089,305 A | 2/1992 | Ushijima et al. |
| 5,172,050 A | * 12/1992 | Swapp ........................ 324/762 |
| 5,317,479 A | 5/1994 | Pai et al. |
| 5,367,254 A | 11/1994 | Faure et al. |
| 5,385,477 A | * 1/1995 | Vaynkof et al. ............... 439/66 |
| 5,386,344 A | 1/1995 | Beaman et al. |
| 5,389,885 A | 2/1995 | Swart |
| 5,488,314 A | * 1/1996 | Brandt et al. ................. 324/758 |
| 5,574,384 A | * 11/1996 | Oi ................................ 324/760 |
| 5,806,181 A | * 9/1998 | Khandros et al. ........... 324/756 |
| 5,852,871 A | * 12/1998 | Khandros .................... 324/754 |
| 5,864,946 A | * 2/1999 | Eldridge et al. ............. 324/754 |

FOREIGN PATENT DOCUMENTS

| | | |
|---|---|---|
| JP | 61-187677 A | 8/1986 |
| JP | 2-150773 A | 6/1990 |
| WO | WO 93/04375 | 3/1993 |
| WO | WO 96/16440 | 5/1996 |

* cited by examiner

Primary Examiner—Minh N. Tang
(74) Attorney, Agent, or Firm—RatnerPrestia; Tiffany L. Townsend, Esq.

(57) ABSTRACT

A semi-conductor wafer test or burn-in apparatus having spring contacts made from a shape memory metal which plastically deforms under normal test loading and has a transition temperature at or above or at or below the burn-in temperature.

22 Claims, 2 Drawing Sheets

FULL WAFER TEST CONFIGURATION USING MEMORY METALS

TECHNICAL FIELD

The present invention pertains to wafer level test and wafer level test and burn-in devices employing a large array of spring contacts held against the wafer undergoing test and/or burn-in.

BACKGROUND OF THE INVENTION

Electrical testing of semi-conductor wafers wherein all the devices in the wafer are tested simultaneously is of considerable interest to the semiconductor industry. At present, the testing of integrated circuit chips in wafer form is limited in scope or tends to be a slow procedure permitting only testing of a few chips at a time. That is, wafer testing is often performed using a mechanical stepping device with few chips (e.g. 1 to 32) tested at a time.

Further, current testing methods do not lend themselves to accelerating failure testing procedures, such as burn-in. A certain percentage of the integrated circuits (ICs) fail in the first few hours or days of use. Under current practice such devices are first packaged and then burnt-in in module form or burnt-in in a single diced chip form. Due to a lack of the necessary wafer level contacting system in industry, no wafer level test or burn-in systems are available. Test and burn-in at the wafer level is the least expensive manufacturing method and is thus highly desired.

An example of a wafer level test and burn-in arrangement is shown in International Patent Application No. PCT/US92/07045 wherein Applicants utilize solder bumps on the test head to contact the full wafer. One disadvantage of this method and apparatus is the extreme force required to make good contact with the wafer. Also, solder deforms permanently after each test, thus requiring reflow of solder on the test fixture after each use.

Another approach is shown in International Application No. PCT/US95/14843 wherein a wafer contact system is made of shaped gold wires and coated with a hard metal (e.g. nickel) to impart desired spring characteristics to the device. A big disadvantage of this approach is that the spring contact will deform permanently if the product wafer and the test head surface are not substantially flat. Due to the fact that extreme planarity in current manufacturing processes can not be assured, this method can not be used for wafer level test and burn-in.

U.S. Pat. No. 4,993,957 discloses replacing the metal contact with a filled polymer ball or cylinder to reduce contact damage during the testing of microelectric devices.

U.S. Pat. No. 5,367,254 describes a buckling beam probe biased to a higher order buckling by lateral slots, thus allowing more travel without increasing lateral deformation.

U.S. Pat. No. 5,389,885 discloses a device with an array of traditional spring contacts replaced by loose pins which are backed by a common diaphragm which provides preload and spring compliance.

U.S. Pat. No. 5,089,305 discloses and claims a manufacturing method wherein stacks of printed wiring boards are interconnected by their respective through-holes by stretching and threading a memory metal through the holes, then raising the temperature to return the wire to its memorized crimped shape. The crimping action puts the wire into intimate contact with the barrel of each through-hole in the stack.

U.S. Pat. No. 4,639,060 discloses making connection to an insulated wire without having to strip the insulation. The connector consists of an aperture which closes by use of a memory-alloy returning to memorized shape when the temperature is raised and thus the insulation is pierced.

Japanese Published Patent Application 60/28583 describes a ZIF socket used to mount an integrated circuit wherein shape-memory alloys are used.

Japanese Patent Application 63/02255 discloses using a shape memory alloy for moving a contact pin in a test fixture for microelectric devices.

SUMMARY OF THE INVENTION

Spring contacts used in a microelectronic wafer test and/or wafer level test and burn-in apparatus are fabricated from a shape memory metal, the shape memory metal plastically deforming under normal test or burn-in contact loading, the metal, in one embodiment, having a transition temperature at or above the burn-in temperature. According to the present invention spring contacts constructed from a shape memory alloy can readily deform to make the necessary contact during the test procedure. Upon retraction from the testing procedure or position the contacts can be heated to their transition temperature and the original shape of the spring contacts is thereby restored.

A preferred shape memory alloy for use in the invention is an alloy of 42 to 48% by weight titanium balance nickel.

Spring contacts can be formed on a composite structure by using a shape memory metal spring attached to a standard spring made of a conventional spring metal such as beryllium copper or phosphor bronze.

In another embodiment of the invention the shape-memory is selected from those metals or alloys that would plastically deform during cool-down after burn-in and have a transition temperature at or below the burn-in temperature.

In any embodiment of the invention the spring metal can be coated with gold or other contact material in the vicinity of the spring that would contact the part undergoing test.

Thus in one embodiment of the invention a semi-conductor wafer test and/or burn-in spring contact is either a shape memory metal, the metal plastically deforming under normal test or burn-in contact loading and having a transition temperature at or above the burn-in temperature or the shape memory metal in combination with another metal.

In another embodiment of the invention a spring contact for a microelectronic test or burn-in device is either a shape memory metal plastically deforming under normal test or burn-in contact loading, the metal having a transition temperature at or above the burn-in temperature or the shape memory metal in combination with another metal.

In yet another embodiment the invention a semi-conductor wafer test and/or burn-in spring contact is either a shape memory metal, the metal plastically deforming under normal test or burn-in contact loading and having a transition temperature at or below the burn-in temperature or the shape memory metal in combination with another spring metal.

A further embodiment of the invention is a spring contact for a microelectric test or burn-in device in either a shape memory alloy that plastically deforms under normal test or burn-in contact loading and has a transition temperature at or below the burn-in temperature or is a shape memory metal in combination with another metal.

The present invention also includes a method of improving a semi-conductor wafer test and/or burn-in apparatus utilizing spring contacts by the step of replacing the spring contact with either a shape memory metal or the shape memory metal and another metal, the shape memory metal selected from the group consisting of a shape memory alloy that plastically deforms under test or burn-in conditions and has a transition temperature at or above the burn-in temperature and a shape memory metal that plastically deforms under test or burn-in conditions and has a transition temperature at or below the burn-in temperature.

DETAILED DESCRIPTION OF THE INVENTION

Wafer level test and wafer level test and burn-in require a very large array of spring contacts which are held to a Z-tolerance of 1 to 2 mils. Tight pitch (typically 0.25 mm or less), minimum contact force requirements and high temperature testing combine to make a viable spring array solution very difficult. The problem results from contacts on the wafer surface and the spring tips being non-planar. As the two surfaces are brought together, first one, then more and more contacts are made. The travel must be sufficient, so that the last mating contact develops enough contact force for high temperature burn-in and test. At extreme travel distances, it is possible that the first spring making contact with the wafer undergoing test has been over stressed and takes a permanent set or deformation. When this happens it is possible that during the next test, the spring having, undergone permanent deformation will not make contact with the wafer, thus making the testing more difficult.

This problem is inherent to the testing of large areas of densely packed contacts since neither the plane of the test surface contacts, nor the plane of the contact springs is perfectly flat.

Figure 1:
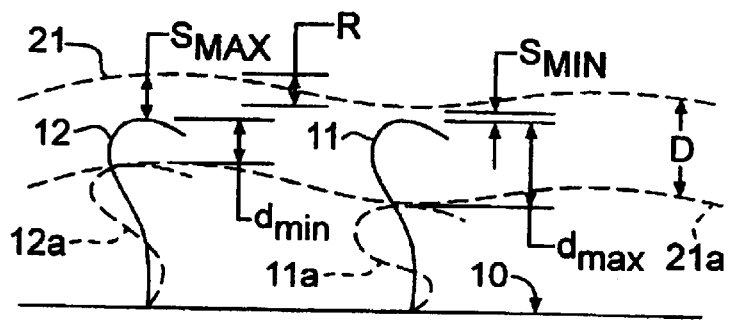
FIG. 1, is a schematic representation of contact springs at rest and under deformation.

Referring to FIG. 1, a probe card 10 has two springs 11 and 12. Spring 11 has the least vertical distance shown as $S_{min}$, and spring 12 has the maximum vertical distance shown as $S_{max}$ from the surface 21 being tested. For purposes of illustration springs 11 and 12 are shown to be adjacent, however, they can be widely separated within a given array. The range of vertical distances for all springs in an array is indicated by R which is defined as $R=S_{max}-S_{min}$. Springs 11 and 12 and surface 21 are shown in their normal position prior to test. As the test card 10 is brought into contact with the device being tested surface 21 assumes the position shown by dashed line 21a and springs 11 and 12 assume the compressed positions shown by dashed lines 11a and 12a.

Figure 2:
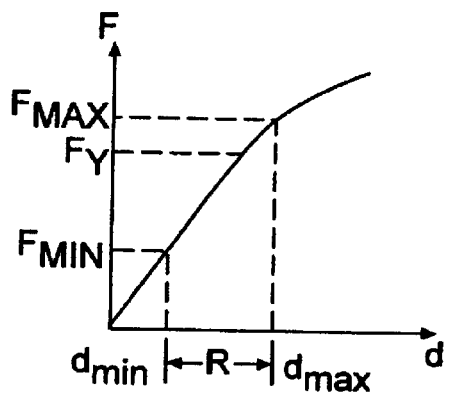
FIG. 2, is a plot showing force-displacement characteristics of a single spring.

FIG. 2 is a schematic force-displacement characteristic of a single spring. In FIG. 2, the slope of the linear portion of the curve is known as the elastic stiffness. At some force, $F_y$, the spring deforms non-linearly and, on release of the force, retains a permanent set or permanent deformation. A minimum force $F_{min}$ is required for each contact to insure reliable electrical performance over the duration of the test. This minimum force is the function of, among other factors, the specific composition of the contact, contact geometry, test conditions and ambient conditions. To ensure that each contact array reaches $F_{min}$, the most vertically distant spring (12 in FIG. 1) must be compressed enough to have a force $F_{min}$, corresponding to a displacement $d_{min}$. Thus, the surfaces 10 and 21 must be moved toward each other a distance $D=S_{max}+d_{min}$. While this is happening the spring 11, closest to the surface before compression, is compressed a distance $d_{max}=D-S_{min}$ which is a distance R further than the spring (12) that is furthest from the surface 21 prior to compression is compressed. Thus, as shown in FIG. 2, when this takes place a force $F_{max}$ is produced.

If $F_{max}$ exceeds the yield force $F_y$ of spring 11 ($F_{max}>F_y$), the spring, 11 takes a permanent deformation or set after completion of the test and the probe and test surfaces are separated. As the next part to be tested may, have a different surface topology it can be seen that as more and more tests are made the plane of the probe contacts 10 will become more and more irregular and reliable contact over the entire array will be more difficult to achieve. The larger the range of the distance identified as R, the higher the minimum required contact force, $F_{min}$, and the lower the yield force $F_y$, the more likely it will be that $F_{max}$ is > than $F_y$.

Figure 3:
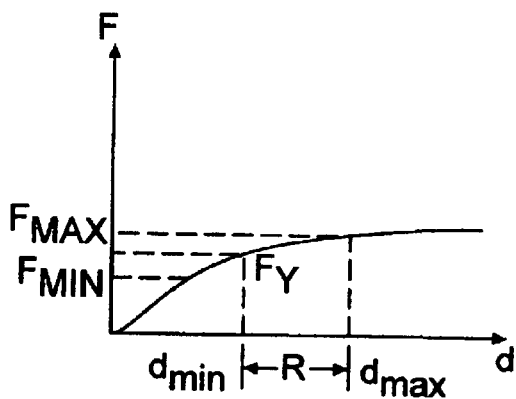
FIG. 3, is a force displacement graph for a spring according to the present invention.

FIG. 3 is a force-displacement characteristic of a single spring according to the invention. The discussion with regard to FIG. 2 above is identical for FIG. 3 in regard to movement of the spring over repeated testing. However, the spring contacts according to the present invention are made from a memory metal that is selected to yield and plastically deform. The preferred shape memory alloys are alloys of nickel and titanium or cobalt. A preferred shape memory alloy consists of 42 to 48% by weight titanium balance nickel. One alloy that would be particularly effective is one of 45% by weight titanium, balance nickel. As the springs are compressed, as shown in FIGS. 1–3, the shape memory alloys take a permanent set. When the test is completed the spring contacts according to the present invention are heated to the transition temperature for the shape memory alloy and the springs are returned to their initial position or shape. The alloy is selected so that the transition temperature is at or above the temperature at which the burn-in takes place. It is possible to select an alloy with a transition temperature that is equal to the temperature at which burn-in takes place or any temperature from the burn-in temperature to a temperature at which the wafer and/or the test fixture and/or test instrument would be damaged. For reasons of economics and process efficiency a temperature slightly above the burn-in temperature is preferred. For example if the maximum burn-in temperature is 150° C. then the alloy can be formulated to have a transition temperature of 200° C. The shape memory alloy will have relatively low yield point i.e. comparable to annealed copper. This will be sufficient to develop adequate contact force, while not overstressing the springs interconnection (i.e. brazing), to the test card. Thus, alloys according to the present invention can withstand many deform/restore cycles without permanent loss of shape.

Figure 4:
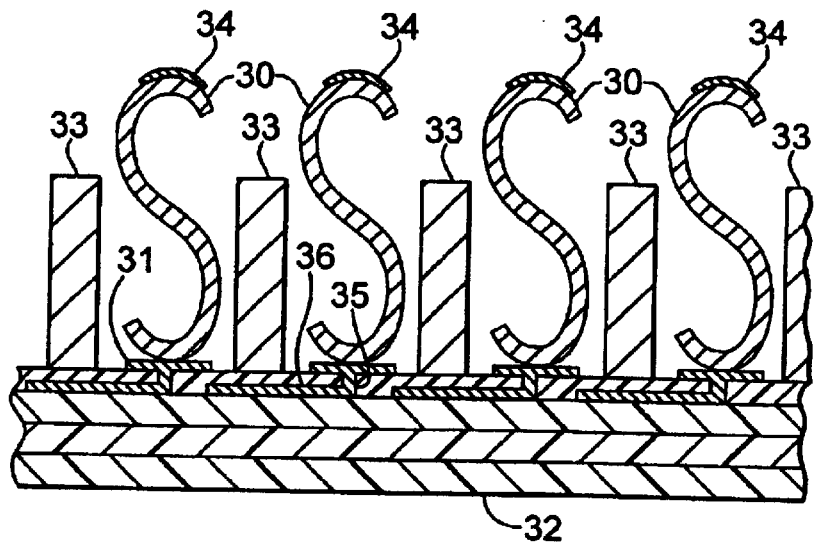
FIG. 4, is a cross-sectional schematic representation of a device according to the present invention.

FIG. 4, is illustrative of one embodiment of the present invention wherein an array of memory metal springs 30 are permanently fixed to contacts 31 on a test board 32. The test board 32 contains vias 35 and internal wiring 36, to transfer the test signals between the test part and the test computer (not shown). Each spring 30 may have a coating 34 of gold or other contact material in the area of its contact surface with the device undergoing test. Test board 32 is preferably made of a material which has a coefficient thermal expansion closely matched to that of the part being tested. A housing 33 is incorporated into the test board 32 to protect the springs 30 from accidental damage and short circuiting. The housing 33 permits the springs to protrude at least a distance sufficient so that the desired contact force can be attained for each spring in the array.

Figure 5:
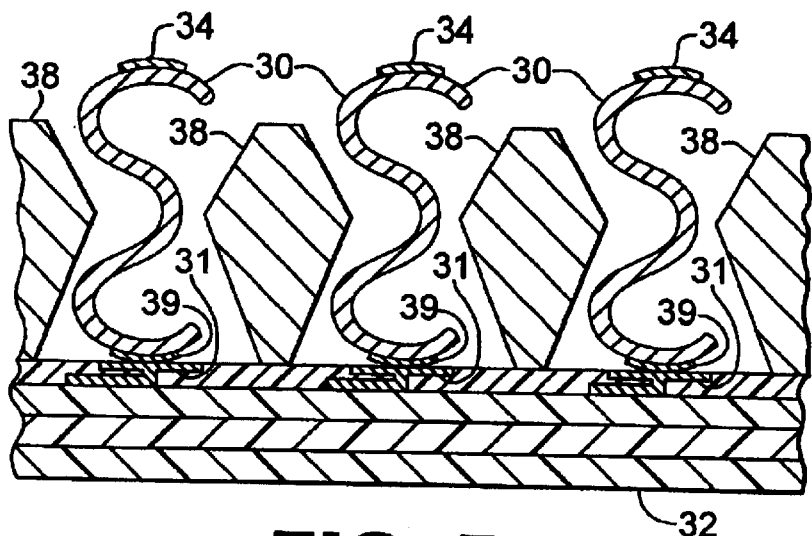
FIG. 5, is a schematic cross-sectional representation of an alternate embodiment of the present invention.

FIG. 5, shows another embodiment of the invention where the springs 30 are disposed in a carrier 38 which is not an integral part of the test board 32, but is clamped to the test board. The surface of the test board 32 is provided with an array of contacts 31 which mate with the springs 32. Springs 32 may have coatings 34 and 39 of gold or other contact material in the vicinity of the contact with the test part (not shown) at 34 and with the test board 32 at 39.

It is also within the scope of the present invention to have the springs with different shapes or configurations so long as they produce the desired force/displacement characteristics.

Figure 6:
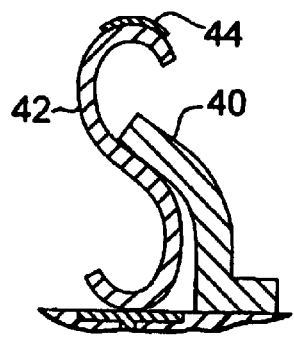
FIG. 6, is a schematic representation illustrating a composite spring according to the present invention.

Referring to FIG. 6, a shape memory metal spring 40 is attached to a second spring 42 which is made of a standard spring metal such as beryllium copper or phosphor bronze. Spring 42 can have a gold or other contact material 44 deposited in the vicinity of contact with the test part. The principal of operation for the composite spring according to FIG. 6 would be the same as for a spring made of the shape memory metal alone. The composite spring could have enhanced benefits in regard to electrical performance, contact force and atmospheric stability while the shape memory metal will restore the spring to its original position after the test is completed. Such springs could be applied in the arrays shown in FIGS. 4 and 5.

It is within the scope of the present invention to select a memory metal alloy (spring) with a transition temperature at or below the burn-in temperature. It is possible to select an alloy with a transition temperature between room temperature and the burn-in temperature. For the present invention the preferred temperature is slightly below the burn-in temperature. For example, if the burn-in temperature is 150° C. (302° F.) the transition temperature should be 125° C. (293° F.). In this case the memory metal tends to revert to its original "memorized" shape during heating up to temperature. One advantage to be gained by using this type of memory metal is that the memory metal spring is above its transition temperature during burn-in and this exerts a greater contact force. This type of memory metal could be used with the devices of FIGS. 4, 5 and 6.

In either embodiment of the invention, i.e. where the transition temperature of the alloy is either at or above or at or below the burn-in temperature the transition temperature can be substantially close to the burn-in temperature.

According to the present invention by using the shape memory metal, instead of using every possible design degree of freedom and compromising performance to insure that none of the springs yield during actuation, the spring can be designed to yield and plastically deform. Thus, large z-tolerances can be tolerated, and the design parameters (e.g. wire diameters, bend radii, plating thickness, etc.) are less critical. Also, the uniformity of contact force across the array is improved. Making the spring contacts of a memory metal or of a combination of a memory metal with a non-memory metal, permits each spring to return to its original shape in preparation for the next wafer simply by heating it above its transition temperature.

Although illustrated and described herein with reference to certain specific embodiments, the present invention is nevertheless not intended to be limited to the details shown. Further, various modifications may be made in the details within the scope of the invention as defined in the following claims.

What is claimed:

1. A spring contact for temporary attachment of a semiconductor wafer to a test and/or burn-in apparatus, said spring fabricated from one of a shape memory metal, said shape memory metal plastically deforming under normal test or burn-in contact loading and having a transition temperature at or above the burn-in temperature, or said shape memory metal in combination with another metal.

2. An apparatus according to claim 1 wherein said shape memory metal is an alloy of Nickel and one of titanium or cobalt.

3. An apparatus according to claim 2 wherein the alloy is 42 to 48% by weight titanium, balance nickel.

4. An apparatus according to claim 3 wherein the alloy is 45% by weight titanium, balance nickel.

5. An apparatus according to claim 1 including means to array a plurality of said spring contacts in a test board.

6. An apparatus according to claim 5 wherein said means to array said spring contacts is a material having a coefficient of thermal expansion substantially close to that of said wafer undergoing testing or burn-in.

7. An apparatus according to claim 6 wherein said means to array said spring contacts is selected from the group consisting of invar, silicon or glass ceramic.

8. An apparatus according to claim 5, wherein said means to array said spring contacts in a test board is a carrier.

9. A spring contact for temporary attachment of a microelectronic test or burn-in device being one of a shape memory metal plastically deforming under normal test or burn-in contact loading and having a transition temperature at or above the burn-in temperature, or said shape memory metal in combination with another metal.

10. A spring contact according to claim 9 fabricated from an alloy of 42 to 48% by weight titanium balance nickel.

11. A spring contact according to claim 10 wherein the alloy is 45% by weight titanium, balance nickel.

12. A spring contact for temporary attachment of a semiconductor wafer test and/or burn-in apparatus, said spring contact fabricated from one of a shape memory metal said shape memory metal plastically deforming under normal test or burn-in contact loading and having a transition temperature at or below the burn-in temperature, or said shape memory metal in combination with another spring metal.

13. An apparatus according to claim 12 wherein said shape memory metal is an alloy of nickel and one of titanium or cobalt.

14. An apparatus according to claim 13 wherein the alloy is 42 to 48% by weight titanium balance nickel.

15. An apparatus according to claim 12 including means to array a plurality of said spring contacts in a test board.

16. An apparatus according to claim 15 wherein said means to array said spring contacts is a material having a coefficient of thermal expansion substantially close to that of said wafer undergoing testing or burn-in.

17. An apparatus according to claim 16 wherein said means to array said spring contacts is selected from the group consisting of invar, silicon or glass ceramic.

18. An apparatus according to claim 15, wherein said means to array said spring contacts in a test board is a carrier.

19. A spring contact for temporary attachment of a microelectronic test or burn-in device being one of a shape memory metal plastically deforming under normal test or burn-in contact loading and having a transition temperature at or below the burn-in temperature, or said shape memory metal in combination with another metal.

20. A spring contact according to claim 19 fabricated from an alloy of 42 to 48% by weight titanium, balance nickel.

21. A spring contact for temporary attachment of a microelectronic test or burn-in device being one of a shape memory metal which plastically deforms during cool-down after burn-in, said shape memory metal having a transition temperature at or below the burn-in temperature, or said memory metal in combination with another metal.

22. A method of improving a semi-conductor wafer test and/or burn-in apparatus utilizing temporary attachment with spring contacts by the step of:

replacing said spring contacts with one of a spring contact fabricated from a shape memory metal or a shape memory metal spring in combination with a spring made from a standard spring metal, wherein said shape memory metal is one of; a shape memory metal that plastically deforms under test or burn-in conditions and has a transition temperature at or above the burn-in temperature, or a shape memory metal that plastically deforms under test or burn-in conditions and has a transition temperature at or below the burn-in temperature.

* * * * *